United States Patent [19]
Baliga et al.

[11] Patent Number: 4,969,027
[45] Date of Patent: Nov. 6, 1990

[54] POWER BIPOLAR TRANSISTOR DEVICE WITH INTEGRAL ANTISATURATION DIODE

[75] Inventors: Bantval J. Baliga, Clifton Park, N.Y.; Frederick Schlecht, Lexington, Mass.

[73] Assignee: General Electric Company, Schenectady, N.Y.

[21] Appl. No.: 220,649

[22] Filed: Jul. 18, 1988

[51] Int. Cl.[5] ............................................. H01L 29/74
[52] U.S. Cl. ........................................ 357/38; 357/34; 357/39; 357/42; 357/43; 357/23.4
[58] Field of Search ....................... 357/34, 38, 39, 42, 357/43, 23.4

[56] References Cited

U.S. PATENT DOCUMENTS

| | | | |
|---|---|---|---|
| 4,443,931 | 4/1984 | Baliga et al. | 357/43 |
| 4,521,795 | 6/1985 | Coe et al. | 357/23.4 |
| 4,605,948 | 8/1986 | Martinelli | 357/34 |
| 4,613,887 | 9/1986 | Fukuda et al. | 357/43 |
| 4,631,561 | 12/1986 | Foroni et al. | 357/38 |
| 4,641,174 | 2/1987 | Baliga | 357/58 |
| 4,739,386 | 4/1988 | Tanizawa | 357/34 |
| 4,767,722 | 8/1988 | Blanchard | 357/23.4 |
| 4,823,172 | 4/1989 | Mihara | 357/42 |

OTHER PUBLICATIONS

H. Taub et al., *Digital Integrated Electronics*, McGraw-Hill, Inc., 1987, pp. 49–51.
S. K. Ghandi, *Semiconductor Power Devices*, J. Wiley & Sons, 1977, pp. 188–243.
B. J. Baliga, *Modern Power Devices*, J. Wiley & Sons, 1987, pp. 350-14 401.

*Primary Examiner*—Rolf Hille
*Assistant Examiner*—Steven Loke
*Attorney, Agent, or Firm*—Marvin Snyder; James C. Davis, Jr.

[57] ABSTRACT

A high power bipolar transistor device includes an integral antisaturation Schottky diode resulting from direct contact between the metallic base electrode and the collector region of the transistor. The barrier height of the Schottky diode is chosen so that it turns on at a slightly lower voltage than the collector-base voltage at saturation and diverts excess drive current away from the base to prevent the transistor from becoming fully saturated. The integral Schottky diode may also be used to prevent latch-up in a thyristor device or in a parasitic thyristor which forms part of an insulated gate transistor.

14 Claims, 8 Drawing Sheets

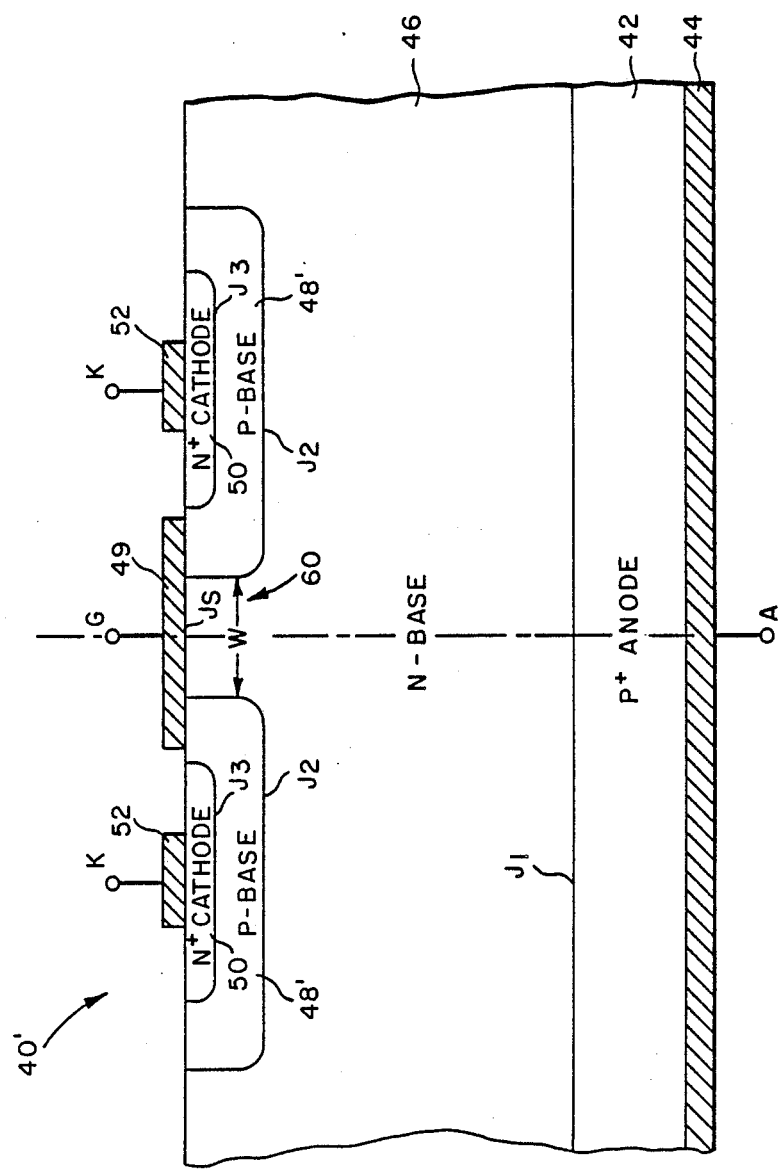

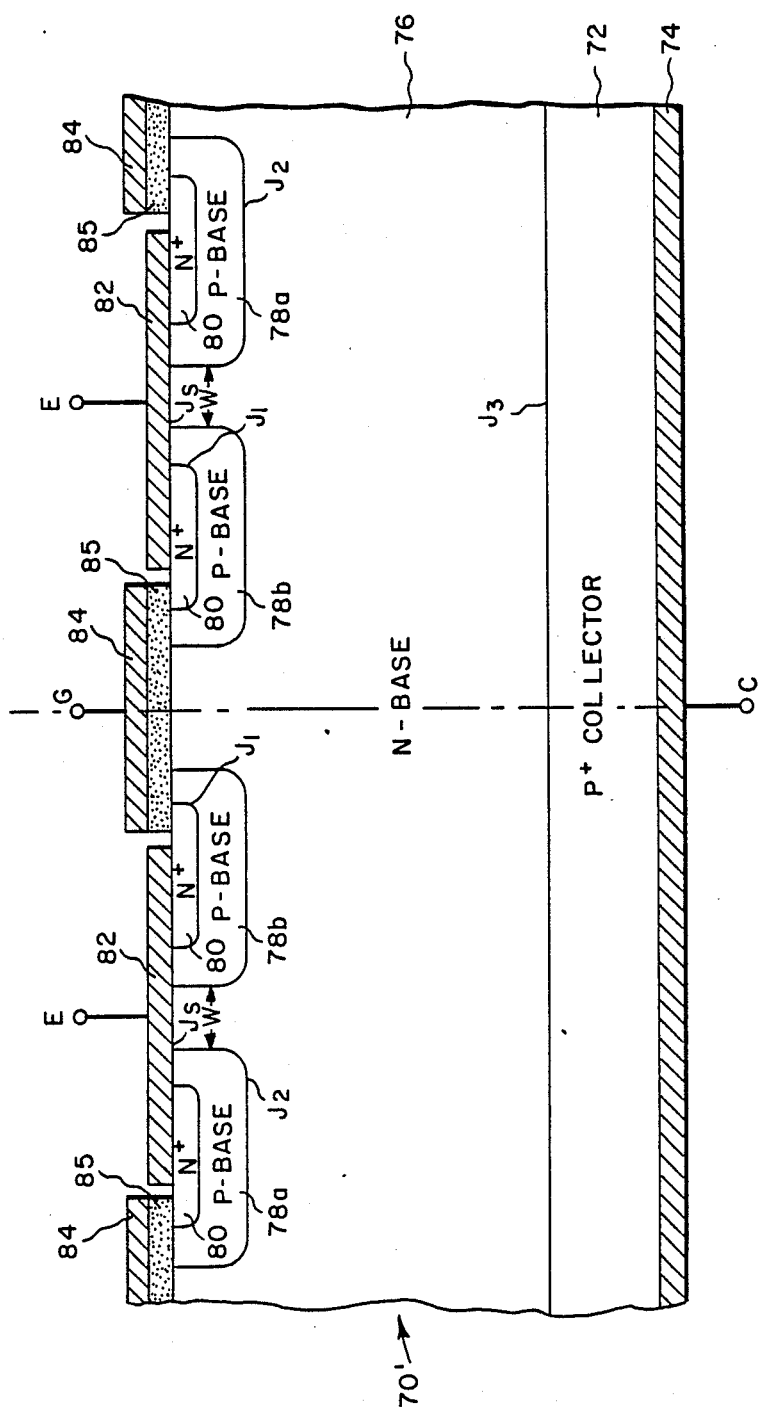

POWER BIPOLAR TRANSISTOR DEVICE WITH INTEGRAL ANTISATURATION DIODE

RELATED APPLICATION

A copending U.S. patent application Ser. No. 221,482 entitled "Power Transistor Structure With High Speed Integral Antiparallel Diode" contains subject matter related to the subject matter of the present application and is incorporated herein by reference. This related application is being filed for B. J. Baliga and M. F. Schlecht on July 19, 1988 and is assigned to the assignee hereof.

FIELD OF THE INVENTION

The present invention relates to power bipolar semiconductor transistor devices in which a high speed Schottky diode is integrated as an antisaturation clamp.

BACKGROUND OF THE INVENTION

Power bipolar transistors are widely used as switches in static power conversion circuits. In many of these applications it is desirable to have switch turn-on and turn-off times as short as possible. One component of the turn-off time is the storage time. This is the time required to remove the minority charge injected into the base region that is in excess of what is needed to make the transistor saturate. To reduce the storage time in a conventional low voltage bipolar transistor, the standard solution is to connect a Schottky diode between the base and collector electrodes of the transistor. This diode reduces the amount of minority charge injected into the base region as the transistor approaches saturation. The transistor is thus prevented from becoming saturated because some of the base drive current is diverted through the Schottky diode. (See, e.g., Herbert Taub et al., "Digital Integrated Electronics", McGraw Hill, Inc., 1987, pp. 49–51).

In power bipolar transistors, however, simply connecting a Schottky diode between base and collector electrodes is not suitable for reducing the minority charge injected into the base. One reason is that there is a substantial voltage drop across the bulk resistance of the collector region when the transistor is conducting. Another reason is that the collector-emitter voltage $V_{CE}$ is not well defined in saturation and is a function of the collector current. Moreover, the collector-base P-N junction in a power bipolar transistor extends over a greater distance in the chip than it does in a signal or low power bipolar transistor, and connecting a Schottky diode between the base and collector electrodes does not provide a base drive current diversion path that is distributed across the collector-base junction. As a result, performance of the Schottky diode is dependent solely on the transistor electrode voltages, and the diode conducts increasing amounts of current as collector-base voltage increases. Lead inductance therefore becomes a factor, and the Schottky diode effectiveness in preventing saturation and hence reducing storage time can actually be diminished if this inductance results in increased voltages on the transistor leads. On the other hand, if the Schottky diode can be integrated with the transistor by intimately contacting the collector region over a wide area thereof, the diode can thus be made sensitive to collector-base junction voltage and can divert base drive current with uniform distribution over the entire collector-base junction. In addition, inductive voltages in the transistor leads would have no effect on the Schottky diode thus integrated with the transistor.

Accordingly, one object of the present invention is to provide a high power bipolar transistor device having a short turn-off time.

Another object of the present invention is to provide a high power bipolar transistor device in which excess minority charge buildup in the base region is avoided.

Another object of the present invention is to provide a high power bipolar transistor device with integral diode means for limiting forward bias on the collector-base junction thereof.

Excess base drive current affects the operation of other semiconductor devices, such as thyristors and insulated gate transistors (IGTs), which incorporate bipolar transistor structures. Specifically, a thyristor is a semiconductor device comprising four contiguous layers of successively alternate conductivity type. The device can be switched from a non-conducting state to a conducting state under control of a gate. A detailed description of thyristor devices can be found, for example, in S. K. Ghandi, "Semiconductor Power Devices", pp. 188–243 (John Wiley & Sons, 1977). A thyristor can be considered analogous to a PNP and an NPN bipolar transistor, connected such that the base of each is driven by the collector current of the other. Once the thyristor is turned on via a gate electrode which supplies current to the base of either of the two transistors comprising the thyristor, the transistors drive each other into saturation if the individual transistor gains are sufficiently large. When this happens, the thyristor is no longer under control of its gate electrode and continues to conduct even in the absence of gate drive current. This phenomenon is known as regenerative latch-up. Accordingly, a further object of the present invention is to provide a thyristor which includes integral diode means for limiting thyristor latch-up.

An IGT is a device which combines a metal oxide semiconductor (MOS) gate structure with bipolar current conduction. The IGT exhibits high forward conduction current density, low drive power to an MOS gate structure, fully gate controlled output characteristics with gate turn-off capability, and a unique reverse blocking capability. However, the IGT includes an inherent parasitic P-N-P-N thyristor structure. If this parasitic thyristor latches in the manner described above, current through the IGT can no longer be controlled by the gate. A discussion of IGT devices including prior art techniques for preventing latch-up of the parasitic thyristor can be found in B. J. Baliga, "Modern Power Devices", John Wiley & Sons, 1987, pp. 350–401. A further object of the present invention, therefore, is to provide an IGT with integral diode means for preventing latch-up of the inherent parasitic thyristor.

SUMMARY OF THE INVENTION

In one preferred embodiment, the invention comprises a high-power bipolar transistor in which the collector region directly contacts the metallic base electrode to form a Schottky barrier therewith. The Schottky barrier, thus being integral with the transistor, is designed so that, when it conducts current, its forward voltage drop is less than the actual base-collector junction voltage when the transistor reaches saturation. Thus the Schottky barrier turns on before the transistor reaches saturation and redirects any additional base drive current away from the base region. This reduces the amount of charge stored in the base and thus shortens switching time for the device.

The Schottky barrier employed in the present invention may also be used to prevent regenerative latch-up of a thyristor. As indicated above, the thyristor is analogous to an NPN and a PNP transistor, with the base of one connected to the collector of the other, and vice-versa. These two transistors have a common collector-base junction. The thyristor is provided with an integral Schottky diode which shunts the common collector-base junction. The Schottky barrier height is chosen so that the Schottky diode turns on before the two transistors reach saturation and redirects excess base drive current away from the base regions of the two transistors. This prevents the transistors from reaching saturation and thereby prevents the thyristor from latching, instead allowing the thyristor to remain under control of its gate. In a similar manner, an integral Schottky barrier may be used to prevent latch-up of the parasitic thyristor in an IGT device.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings in which:

FIG. 2C schematically illustrates, in cross-sectional view, two cells of a thyristor device, including an integral Schottky antisaturation diode, on either side of a center-line, in accordance with an illustrative embodiment of the present invention;

FIG. 3C schematically illustrates, in cross-sectional view, two cells of an IGT device, including an integral Schottky antisaturation diode, on either side of a center-line, in accordance with an illustrative embodiment of the present invention.

In the Figures, like elements are identified with like numerals.

DETAILED DESCRIPTION OF THE INVENTION

Figure 1A:
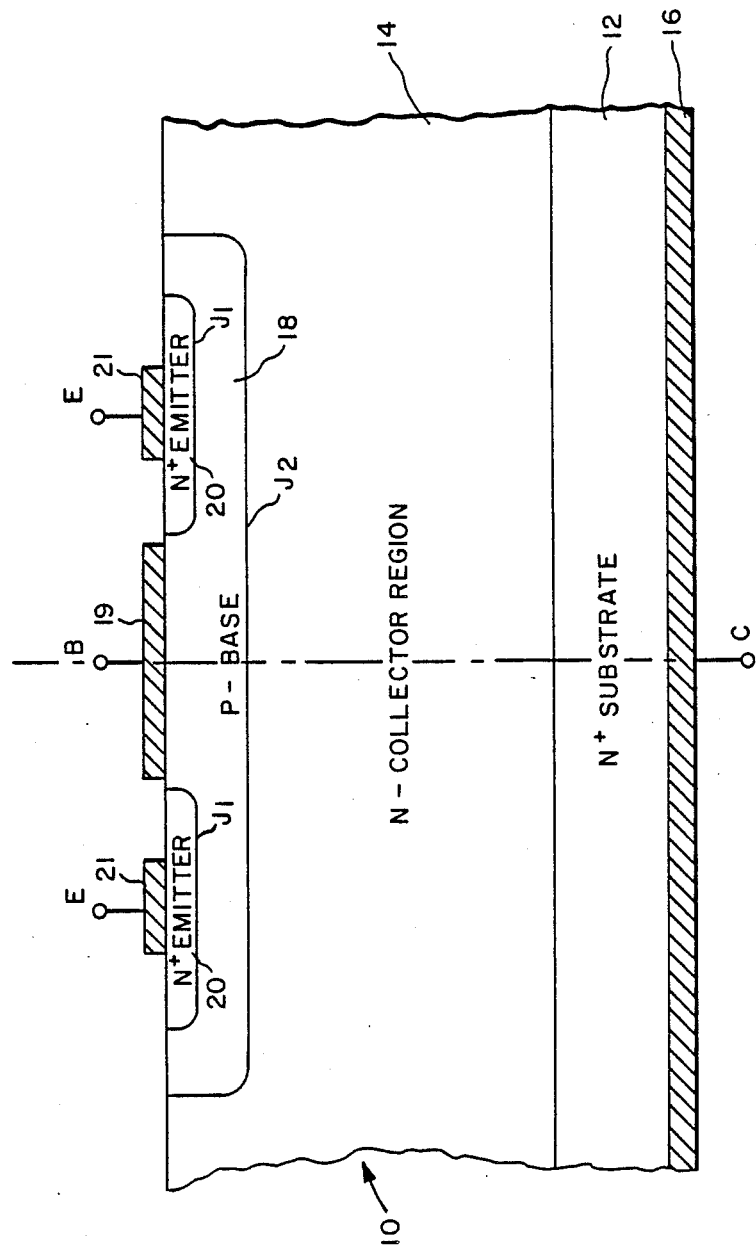
FIG. 1A schematically illustrates, in cross-sectional view, two cells of a prior art vertical power bipolar transistor on either side of a centerline.

In considering the bipolar devices of the present invention, it is helpful to first review operation of a conventional vertical power bipolar transistor, such as device 10, illustrated in FIG. 1A. Device 10 includes a heavily doped N+ semiconductor substrate 12 with a metallic collector electrode 16 on the bottom surface of substrate 12. A less heavily doped N-type conductivity semiconductor collector layer 14 is epitaxially grown on the upper surface of substrate 12. Dopants to form a P-type conductivity base region 18 are diffused into the upper surface of layer 14. A base electrode 19 makes contact with P-base region 18 at the upper surface of layer 14. Dopants to form a heavily doped N emitter region 20 are diffused into the upper surface of layer 14 within P-base region 18. A metallic emitter electrode 21 makes contact with N+ emitter region 20 at the upper surface of layer 14.

In operation, when transistor 10 is in the forward blocking mode, P-N junction $J_1$ between the emitter and base regions is not forward biased. When this condition occurs, as for example when base and emitter electrodes 19 and 21, respectively, are short-circuited, there is no minority carrier injection across junction $J_1$ into base region 18. If a positive voltage is now applied to collector electrode 16, P-N junction $J_2$ between P-base 18 and N collector layer 14 is reverse biased and no current flows between collector and emitter.

If emitter base junction $J_1$ is now forward biased, minority carriers are injected from emitter region 20 into base region 18. These minority carriers diffuse across the base region and are collected by the reverse biased junction $J_2$. This is the so-called active gain mode of operation. If junction $J_2$ is now forward biased, (illustratively by setting the collector electrode voltage at about −0.7 volts relative to the base electrode voltage for a silicon device) injection of minority carriers into base 18 takes place from both emitter region 20 and N-layer 14. Transistor 10 is thus driven into saturation and current flows from the collector to the emitter at a magnitude determined by circuit parameters external to the transistor.

When transistor 10 is saturated, a large amount of minority charge is stored in base region 18. In order to switch from the saturation or forward conducting mode into the forward blocking mode, it is therefore necessary to remove the excess minority charge stored in the base. Because of the time required to accomplish this removal of charge, bipolar transistor 10 exhibits relatively slow switching, at least compared to metal oxide semiconductor field effect transistors, or MOSFETs.

Figure 1C:
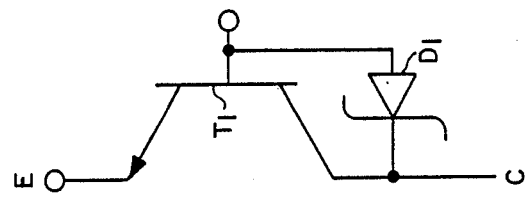
FIG. 1C is a schematic diagram of the equivalent circuit of the device of FIG. 1B.
Figure 1B:
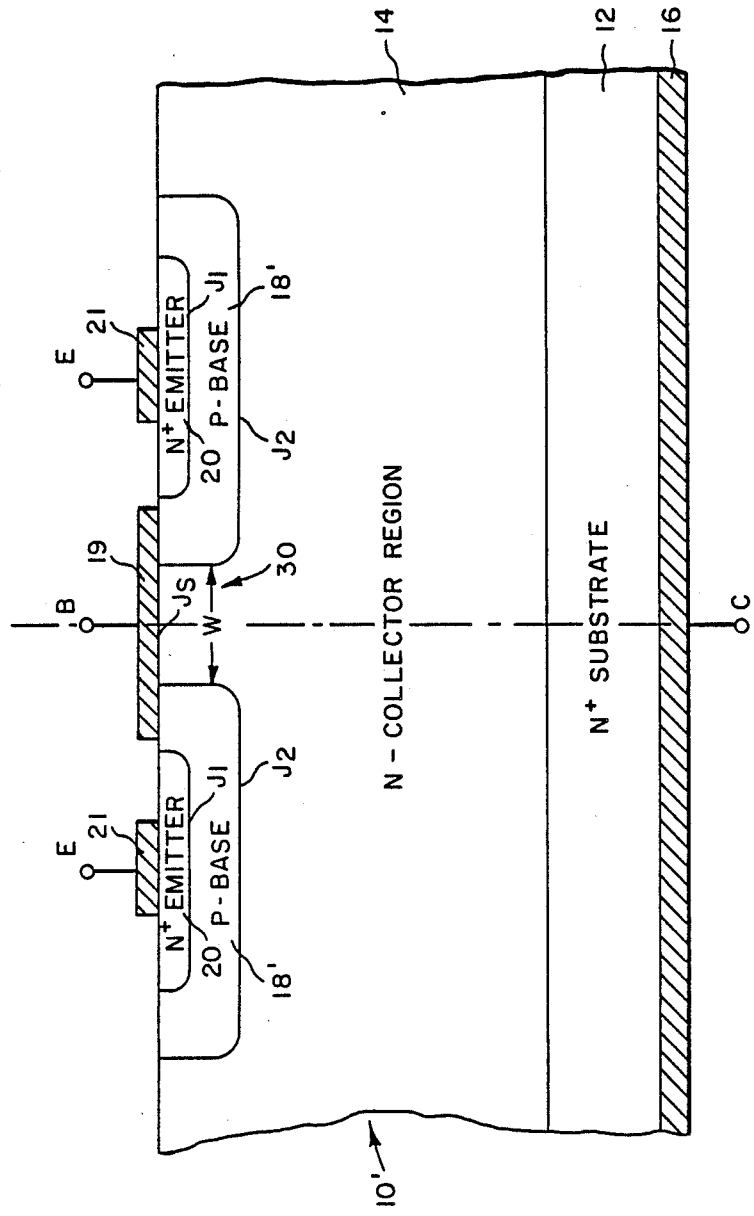
FIG. 1B schematically illustrates, in cross-sectional view, two cells of a vertical power bipolar transistor, including an integral Schottky antisaturation diode, on either side of a centerline, in accordance with an illustrative embodiment of the present invention.

FIG. 1B illustrates a vertical power bipolar device 10' in accordance with an illustrative embodiment of the present invention, which can operate in a forward conducting mode without injection of large amounts of excess minority charge into the base region. Thus, device 10' has a shorter switching time than device 10 of FIG. 1A.

Construction of device 10' of FIG. 1B is the same as that of device 10 of FIG. 1A except that base region 18', unlike base region 18 of FIG. 1A, does not extend beneath the entire expanse of base electrode 19 but instead extends beneath only the periphery thereof, leaving a channel region 30 in N-collector layer 14 thereunder. This permits base electrode 19 to directly contact N-collector layer 14 and form a Schottky barrier $J_s$ therewith. For reasons discussed below, the turn-on voltage of the Schottky barrier is chosen to be slightly less than the collector-base voltage (i.e. the voltage across junction $J_2$) when device 10' is in saturation.

In the forward blocking mode, P-N junction $J_1$ between emitter region 20 and base region 18' is not forward biased. (Such mode would result, for example, from shorting the base and emitter electrodes 19 and 21, respectively.) Consequently, when a positive voltage is applied to collector electrode 16, P-N junction $J_2$ is reverse biased. In particular, channel region 30 of layer 14 situated interiorly of, or surrounded by, P-base 18' is of width W between the base regions chosen so that the depletion zones surrounding the reverse biased junction $J_2$ pinch off channel 30 and prevent flow of any leakage current through Schottky barrier $J_s$.

If junction $J_1$ is now forward biased, minority carriers are injected across junction $J_1$, into base region 18'. These minority carriers diffuse across the base region and are collected by the reverse biased junction $J_2$. This is the active gain mode of operation.

Device 10' can operate in a forward conducting mode without forward biasing junction $J_2$ to a level sufficient to inject large amounts of minority carriers into base region 18' and drive the transistor into saturation. The reason is that Schottky barrier $J_s$ is forward biased at a slightly smaller voltage than the collector-base voltage needed to saturate the base. For example, when implemented in silicon, the collector-base voltage at saturation may be about $-0.7$ volts while Schottky barrier $J_s$ becomes forward biased when the collector-base voltage is $-0.6$ volts. Thus, when the collector voltage is set so that Schottky barrier $J_s$ is forward biased, the collector-base voltage is limited to a maximum amplitude equal to the Schottky barrier voltage. As a result, excess base drive current flows directly into base electrode 19 and excess minority charge does not build up in the base region. Accordingly, power bipolar transistor device 10' of FIG. 1B has a shorter switching time than power bipolar or 10 of FIG. 1A.

FIG. 1C schematically illustrate equivalent circuit of bipolar transistor 10' of FIG. 1A. The equivalent circuit comprises an NPN bipolar transistor $T_1$ including emitter, base and collector electrodes and a Schottky diode $D_1$ connected between the base and collector. Schottky diode $D_1$ is forward biased at a slightly lower voltage than the collector-base junction. Thus the collector-base voltage is limited to an amplitude sufficient to forward bias Schottky diode $D_1$ but not the collector-base junction, and excess base drive current is accordingly diverted away from the base region.

Typically, power bipolar transistor device 10' of FIG. 1B is fabricated of silicon in which case N+ substrate 12 has a thickness of 500 microns and a dopant concentration of $10^{20}$ cm$^3$. N-layer 14 has a thickness of 50 microns and a dopant concentration of $10^{14}$ per cm$^3$. P-base region 18' has a diffusion depth of about 10 microns and dopant concentration of about $10^{17}$ per cm$^3$. Similarly, N+ emitter region 20 has a diffusion depth on the order of 5 microns and dopant concentration on the order of $10^{20}$ per cm$^3$. Distance W is about 10 microns. Illustratively, emitter and base electrodes 21 and 19, respectively, comprise aluminum, and collector electrode 16 comprises nickel. Device 10', heretofore described as comprising a heavily doped substrate on which a lightly doped collector layer is grown, may alternatively be fabricated by starting with a lightly doped wafer or substrate, which comprises the collector region, and forming, by diffusion, a heavily doped layer on one surface thereof to which the collector electrode is attached.

Figure 2A:
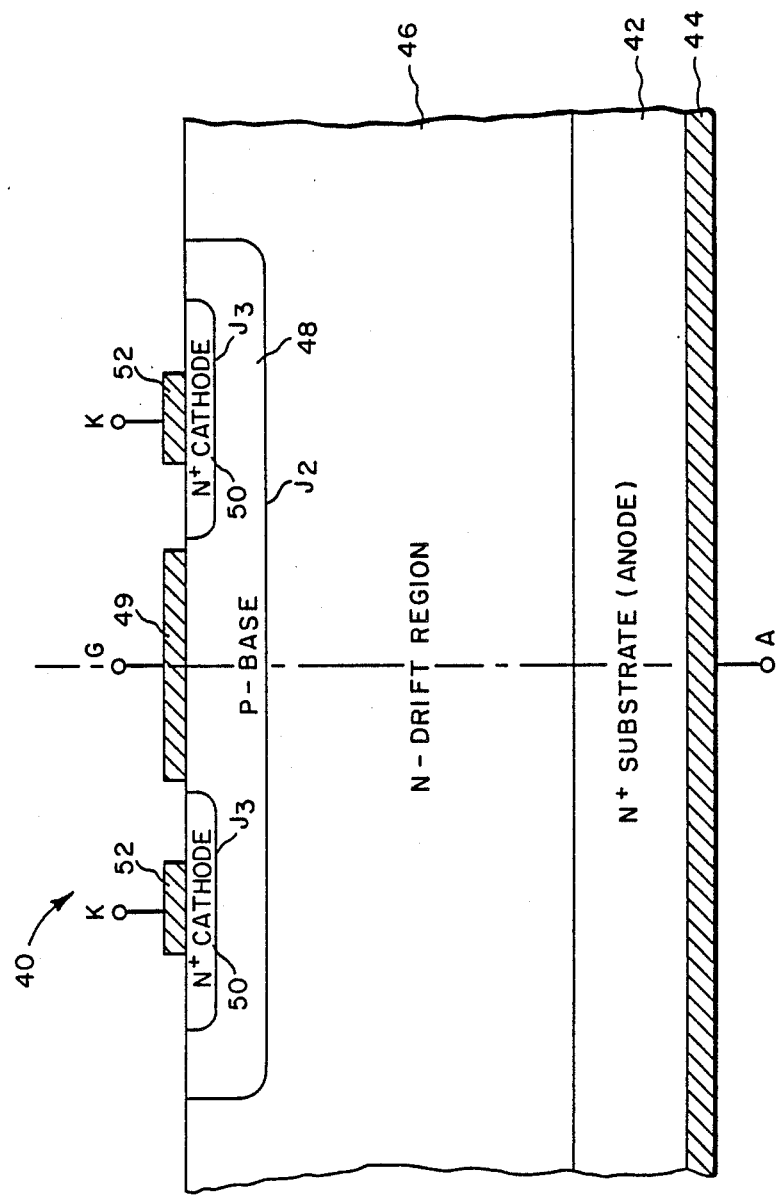
FIG. 2A schematically illustrates, in cross-sectional view, a prior art thyristor.

In employing the Schottky barrier antisaturation diode of the present invention to limit the degree to which a thyristor regeneratively latches up, it is preferable to consider first a conventional thyristor 40, such as illustrated in FIG. 2A. Thyristor 40 comprises a heavily doped P+ substrate 42 with a metallic anode electrode 44 on the lower surface of the substrate. A less heavily doped N-layer 46 is epitaxially grown on the upper surface of substrate 42 and forms a P-N junction $J_1$ therewith. A P-base region 48 is diffused into the upper structure of layer 46 to form a P-N junction $J_2$ therewith, and is in contact with a gate electrode 49. An N+ cathode region 50 is diffused into P-base region 48 to form a P-N junction $J_3$ therewith, and is in contact with cathode 52.

When operating in a reverse blocking mode, P-N junctions $J_1$ and $J_3$ of device 40 are reverse biased (i.e., cathode 52 is positive with respect to anode 44). In the forward blocking mode (i.e., anode 44 positive with respect to cathode 52) junction $J_2$ is reverse biased, while in the forward blocking mode, junctions $J_1$ and $J_3$ are forward biased. Thus regions 50, 48, and 46 behave like an NPN transistor with N+ region 50 serving as the emitter and P-type conductivity region 48 serving as the base. Similarly, regions 42, 46, and 48 behave like a PNP transistor with P+ substrate 42 serving as the emitter. For both transistors, junction $J_2$ serves as the collector-base junction.

Injection of current into base region 48 of the NPN transistor by way of gate electrode 49 causes an increase in forward current between region 48 and region 46. This increases the base current of the PNP transistor which in turn begins to conduct, providing additional base drive current for the NPN transistor. The process is thus one of positive feedback.

If the gains of the two transistors in the positive feedback loop are sufficiently large, current in the device will grow until the device exhibits a very low voltage drop in its forward conducting direction, at which time the device is in its forward conducting mode. In particular, the current can grow sufficiently so that the two transistors comprising the thyristor drive each other into saturation, at which time the thyristor is no longer controllable through its gate electrode. In the presence of sufficient load current in the anode-to-cathode circuit of the thyristor, the device continues to conduct even when no drive current is supplied by the gate electrode. This phenomenon is known as regenerative latch-up.

Figure 2D:
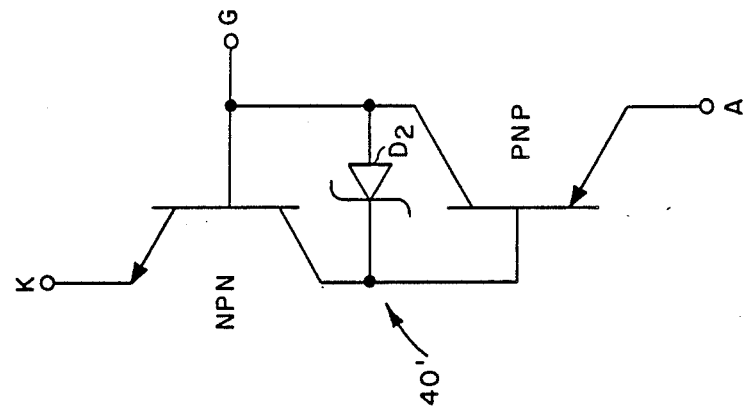
FIG. 2D is a schematic diagram of an equivalent circuit of the device of FIG. 2C.
Figure 2B:
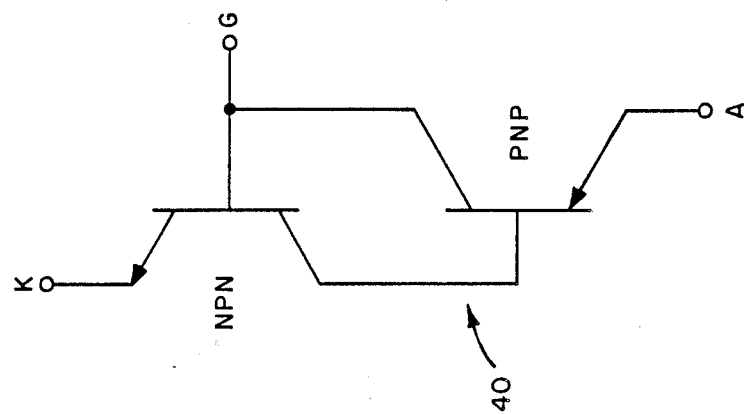
FIG. 2B is a schematic diagram of the equivalent circuit of the device of FIG. 2A.

FIG. 2B shows the equivalent circuit of device 40 of FIG. 2A as comprising an NPN and a PNP transistor interconnected so that the base of each is driven by the collector current of the other. Thus the two transistors can drive each other into saturation so that the thyristor is no longer under the control of its gate.

This latch-up phenomenon can be limited in accordance with the present invention by modifying thyristor 40 of FIG. 2A so that region 46 directly contacts metallic gate electrode 49 and forms a Schottky barrier therewith. By limiting the degree of latch-up, the thyristor turn-off speed is made faster than that for the unmodified thyristor 40 of FIG. 2A. Such modified device is shown in FIG. 2C. In particular, base region 48 in FIG. 2A is now separated into portions 48' which extend only beneath a peripheral portion of gate electrode 49 so that N-region 46 directly contacts the gate electrode and forms a Schottky barrier $J_s$ therewith.

The width W of channel 60 between base regions 48' is chosen so that in the forward blocking mode the depletion regions around the reverse biased junctions $J_2$ meet in the channel and pinch it off to prevent flow of leakage current through Schottky barrier $J_s$.

In the forward conducting mode, Schottky barrier $J_s$ diverts excess base drive current from both of the transistors comprising thyristor 40' of FIG. 2C. This limits the degree to which the transistors saturate, thereby limiting the degree to which the thyristor latches up. This can best be understood by considering the equivalent circuit of device 40', which equivalent circuit is shown in FIG. 2D.

As shown in FIG. 2D, thyristor device 40' comprises an NPN transistor and a PNP transistor. (As evident from FIG. 2C, the NPN transistor comprises regions 50, 48a and 48b, and 46. The PNP transistor is formed from regions 42, 46, and 48'.) As in FIG. 2B, the two transistors are connected so that the base of each is driven by the collector current of the other. A Schottky diode $D_2$ shunts the (common) collector-base junctions of both transistors (i.e. junctions $J_2$ in FIG. 2C). The height of Schottky barrier $J_s$ of FIG. 2C is chosen so that diode $D_2$ is forward biased at a level slightly below the anode-gate voltage (i.e. the voltage across junctions $J_2$ of FIG. 2C) when the two transistors are in full saturation. Diode $D_2$ (i.e. the Schottky barrier $J_s$ of FIG. 2C) diverts excess base drive current for both transistors without fully turning on the collector-base junctions of the two transistors. This limits the degree to which the two transistors saturate and hence limits the degree to which the thyristor latches up. Since the Schottky diode also minimizes excess charge storage in the device during the on condition, and provides a path to remove the majority charge of both base regions during the turn-off process, the thyristor turn-off time is reduced.

Typically, device 40' of FIG. 2C is fabricated of silicon in which case P+ substrate 42 has a thickness of 500 microns and a dopant concentration of $10^{20}$ per cm$^3$. N-layer 46 has a thickness of 100 microns and a dopant concentration of $10^{14}$ per cm$^3$. P-base regions 48' have diffusion depths of about 5 microns and dopant concentrations of about $10^{17}$ per cm$^3$. N+ regions 50 have diffusion depths of about 1 micron and dopant concentrations of about $10^{20}$ per cm$^3$. Distance W is about 10 microns. Illustratively, the anode, cathode and gate electrodes are each comprised of aluminum. Although device 40' has been described as being fabricated from a heavily doped substrate 42 on which a lightly doped layer 46 is epitaxially grown, it is also possible to fabricate device 40' in accordance with the present invention by starting with a lightly doped wafer which corresponds to layer 46, and diffusing in heavily doped layer 42 through a surface of the wafer.

Figure 3A:
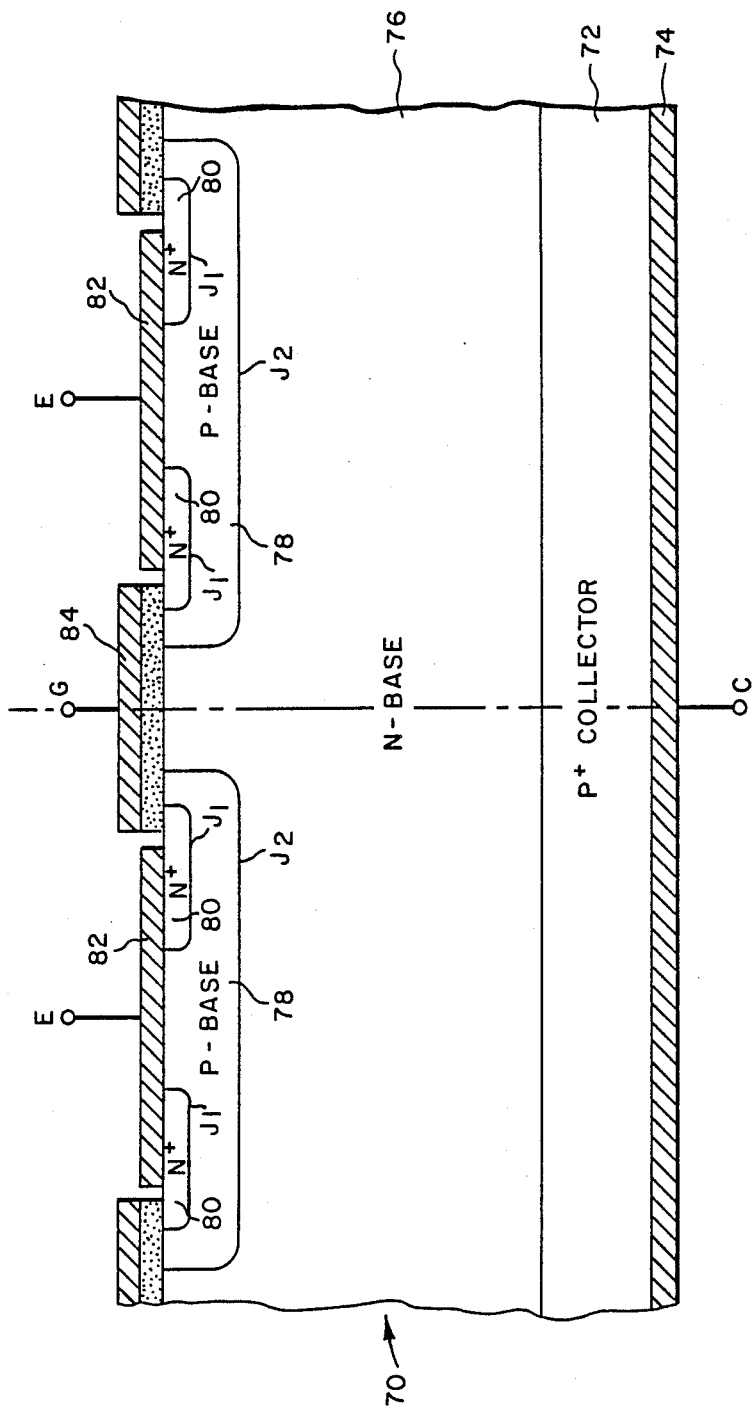
FIG. 3A schematically illustrates, in cross-sectional view, two cells of a prior art IGT on either side of a centerline.

In employing the Schottky barrier antisaturation diode of the present invention to prevent the parasitic thyristor in an IGT from latching up, it is preferable to consider first a conventional IGT 70, such as illustrated in FIG. 3A. IGT 70 comprises a heavily doped P+ substrate 72 with a metallic collector electrode 74 on one surface of P+ substrate 72. A less heavily doped N-base layer 76 is epitaxially grown on the opposite surface of P+ layer 72 to form a P-N junction $J_3$ therewith. A P-base region 78 is diffused into the top surface of N-base layer 76 and forms a P-N junction $J_2$ therewith. A pair of heavily doped N+ emitter regions 80 are diffused into P-base region 78, so as to form P-N junction $J_1$, therewith. Each pair of emitter regions 80 as well as the associated base region 78 are in contact with a metallic emitter electrode 82. IGT 70 also includes a metallic gate electrode 84 on an insulating layer 85 overlying the top surface of layer 76.

In operation, current flow cannot occur when a negative voltage is applied to collector electrode 74 with respect to the emitter electrode 82 because P-N junction $J_3$ between substrate 72 and layer 76 is reverse biased. This provides device 70 with reverse blocking capability. When a positive voltage is applied to collector electrode 74 and gate 84 is short-circuited to emitter electrode 82, junction $J_2$ between N-layer 76 and P-base region 78 becomes reverse biased and device 70 operates in its forward blocking mode. With positive collector electrode voltages, if a positive gate bias is applied of sufficient magnitude to invert the conductivity of P-base region 78 under gate 74, device 70 operates in its forward conducting mode because electrons now flow from N+ emitter region 80 to N-base layer 76. In this forward conducting mode, P-N junction $J_3$ is forward biased and P+ region 72 injects holes into N-base layer 76. When the forward bias is increased, the injected hole concentration increases until it exceeds the background doping level of N-base layer 76. In this mode of operation, the device characteristics are similar to those of a P-i-N diode.

To switch IGT 70 from its on-state to the off-state, it is necessary to discharge gate 84 by short-circuiting it to the emitter terminal. In absence of a gate voltage, the inversion region at the surface of P-base region 78 under gate 84 cannot be sustained. Removal of the gate bias therefore cuts off the supply of electrons to N-base layer 76 and initiates the turn-off process.

IGT 70 contains a parasitic P-N-P-N thyristor structure between the collector and emitter terminals, comprised of P+ substrate 72, N-base layer 76, P-base region 78 and N+ emitter region 80. If this thyristor latches up, current in IGT 70 can no longer be controlled by gate electrode 84. It is thus important to design the IGT device such that this thyristor action is suppressed. In particular, the thyristor action can be suppressed by preventing injection of electrons from N+ emitter region 80 into P-base region 78. N+ emitter region 80 will begin to inject electrons into P-base 78 if junction $J_1$ becomes forward biased by more than 0.7 volts (in a silicon device) as the result of lateral hole current flow in the P-base region. In the forward conduction mode, holes injected into N-base layer 76 from P+ collector region 72 as a result of forward biasing junction $J_3$ are collected by reverse biased junction $J_2$. In a simplified model, these holes can be considered as flowing laterally in P-base region 78 underneath N+ emitter region 80 to emitter electrode 82, thus causing forward biasing of junction $J_1$.

Figure 3D:
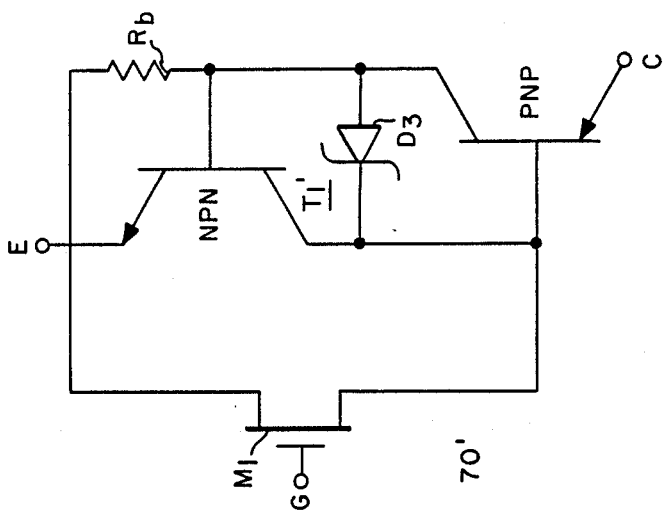
FIG. 3D is a schematic diagram of an equivalent circuit of the device of FIG. 2C.
Figure 3B:
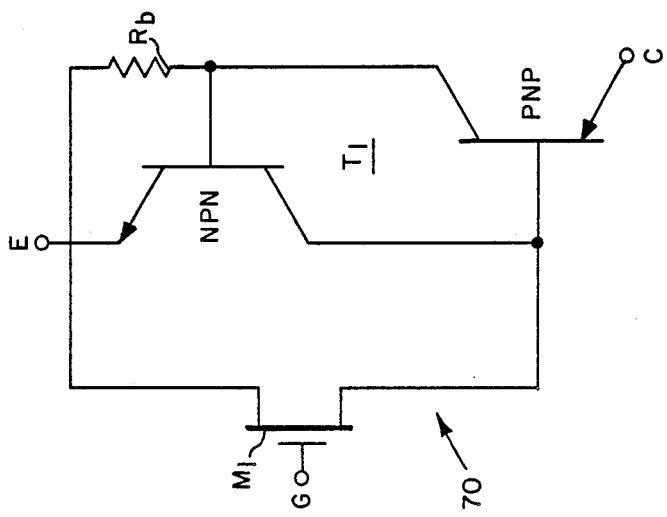
FIG. 3B is a schematic diagram of the equivalent circuit of the device of FIG. 3A.

The equivalent circuit of IGT 70 is shown in FIG. 3B as comprising a parasitic thyristor $T_1$, which extends between the emitter and collector electrodes. Thyristor $T_1$ includes, as visible in FIG. 3A, an NPN transistor (which comprises N+ emitter region 80, P-base region 78 and N-base 76) and a PNP transistor (which comprises P+ substrate 72, N-base 76, and P-base 80). As shown in FIG. 3B, thyristor $T_1$ is connected in parallel with MOS field-effect transistor $M_1$. Resistance $R_b$ is the resistance experienced by hole current which flows laterally in P-base region 78 when device 70 of FIGS. 3A and 3B is in the forward conducting mode. The voltage developed across this resistance serves to forward bias junction $J_1$ in FIG. 3A which is the emitter base junction of the NPN transistor in FIG. 3B. This causes the NPN transistor to conduct and eventually leads to a latch-up of thyristor $T_1$ because the base of each of the NPN and PNP transistors is driven by the collector current of the other so that the two transistors drive each other into saturation. When latch-up occurs, current flowing through device 70 can no longer be controlled by the gate.

As shown in FIG. 3C, the device of FIGS. 3A and 3B has been modified in accordance with the present invention so that the parasitic thyristor therein is not activated. More particularly, base region 78 in FIG. 3A has been separated into two portions 78a and 78b so that N-base 76 directly contacts emitter electrode 82 in device 70′ of FIG. 3C and forms Schottky barrier $J_s$ therewith. The Schottky barrier serves as an antisaturation diode for both of the transistors comprising the parasitic thyristor of the IGT device. The height of Schottky barrier $J_s$ is chosen so that it becomes forward biased at a slightly lower voltage (e.g. 0.6 volts) than the voltage across the common collector-base junction (i.e. junction $J_2$ in FIG. 3C) when the two transistors comprising the parasitic thyristor are in saturation. Thus Schottky barrier $J_s$ can become conductive at a lower forward bias than junction $J_2$, so that excess base drive current can be diverted and complete saturation avoided. Distance W between base regions 78a and 78b is chosen so that, in the forward blocking mode, depletion regions that are created surrounding junctions $J_2$ meet in the space between base regions 78a and 78b and prevent leakage current through the Schottky diode.

The equivalent circuit of device 70′, as shown in FIG. 3D, includes parasitic thyristor $T_1'$ wherein Schottky diode $D_3$ shunts the collector-base junction of the NPN and PNP transistors comprising the thyristor. When forward biased, diode $D_3$ (i.e. Schottky barrier $J_s$ of FIG. 3C) diverts excess base drive current of both transistors and prevents saturation of both transistors.

Typically, device 70′ is fabricated of silicon. In this case, P+ substrate 72 has a thickness of 500 microns and a dopant concentration of $10^{20}$ per cm$^3$. N-base layer 76 has a thickness of 100 microns and a dopant concentration of $10^{14}$ per cm$^3$. Regions 78a, 78b and 80 are formed by diffusion. P-base regions 78a and 78b have a depth of 5 microns and a dopant concentration of $10^{17}$ per cm$^3$. Similarly, N+ region 80 has a depth of 1 micron and a dopant concentration of $10^{20}$ per cm$^3$. Distance W is about 10 microns. The collector and emitter electrodes are fabricated of aluminum, while gate electrode 84 comprises polysilicon atop an insulating layer 85 comprised of silicon dioxide. Although device 70′ has been described as being fabricated of a heavily doped substrate 72 with a lightly doped epitaxial layer 76 grown thereon, it is also possible to fabricate device 70′ by starting with a lightly doped wafer which corresponds to layer 76 and diffusing into one surface of the wafer a heavily doped P+ region to which the collector electrode is attached.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

We claim:

1. A high power bipolar transistor device comprising: a semiconductor body including a collector region of a first conductivity type having an upper surface and a lower boundary, a base region of a second conductivity type extending from said upper surface into said collector region, said base region forming a separate junction, respectively, with said collector region and at least partially surrounding a portion of said collector region, an emitter region of said first conductivity type extending into said base region from said upper surface, and a substrate region of said first conductivity type adjoining said lower boundary and having a lower surface;

a base electrode situated on said upper surface of said collector region so as to directly contact said portion thereof and form a Schottky barrier therewith, said base electrode extending on said upper surface beyond said portion so as to also contact said base region;

an emitter electrode situated on said upper surface so as to contact said emitter region; and a collector electrode situated on, and contacting, said lower surface of said substrate region.

2. The device of claim 1 wherein said emitter region and said substrate region are more heavily doped than said collector region.

3. The device of claim 2 wherein said base region forms a P-N junction with said collector region and doping levels of said base and collector regions are such that reverse bias on said P-N junction establishes a depletion region that blocks current flow in said portion of said collector region.

4. The device of claim 3 wherein the area of said base electrode in contact with said upper surface is selected to provide said Schottky barrier with a lower turn-on voltage than voltage between the collector and base electrodes when the device is in saturation.

5. The device of claim 4 wherein said first conductivity type is N-type and said second conductivity type is P-type.

6. The device of claim 1 wherein said Schottky barrier is forward biased to a level below any forward bias on the junction between said collector and base regions.

7. A thyristor device comprising:

a semiconductor body including a first base region of a first conductivity type having an upper surface and a lower boundary, a second base region of a second conductivity type extending from said upper surface into said first base region, said first and second base regions forming a first P-N junction therebetween, said second base region at least partially surrounding a portion of said first base, a cathode region of said first conductivity type extending into said second base region from said upper surface and forming a second P-N junction therebetween, and an anode region of said second conductivity type adjoining said lower boundary and having a lower surface, said anode region and said first base region forming a third P-N junction therebetween;

an anode electrode in contact with said anode region;

a cathode electrode in contact with said cathode region; and a gate electrode in contact with said second base region, said gate electrode also being in direct contact with said first base region to form a Schottky barrier therewith.

8. The thyristor device of claim 7 wherein the doping level of said first and second base regions are such that said first P-N junction, when reverse biased, establishes a depletion region that blocks current flow between said gate electrode and said first base region.

9. The thyristor device of claim 7 wherein forward bias voltage on said Schottky barrier is sufficiently small to limit the degree to which said thyristor latches up.

10. An insulated gate transistor device comprising:
a semiconductor body including a first base region of a first conductivity type having an upper surface and a lower boundary, a second base region of a second conductivity type extending from said upper surface into said first base region, said first and second base regions forming a first P-N junction therebetween, said second base region at least partially surrounding a portion of said first base region, an emitter region of said first conductivity type extending into said second base region from said upper surface and forming a second P-N junction therebetween, and a collector region of said second conductivity type adjoining said lower boundary and having a lower surface, said collector region and said first base region forming a third P-N junction therebetween;
a collector electrode in contact with said collector region;
an emitter electrode situated on said upper surface so as to directly contact said emitter and second base regions along said upper surface;
an insulated gate electrode for selectively providing a conductive path through said second base region between said emitter and first base regions; and
said emitter electrode further contacting said first base region along said upper surface and forming a Schottky barrier therewith.

11. The insulated gate transistor device of claim 10 wherein said second base region at least partially surrounds a portion of said first base region, said emitter electrode being in direct contact with said first base region at said portion thereof.

12. The insulated gate transistor device of claim 11 wherein said emitter region is situated within the boundaries of said second base region.

13. The insulated gate transistor device of claim 10 wherein the doping levels of said first and second base regions are such that said Schottky barrier becomes conductive at a lower forward bias than said second P-N junction.

14. The insulated gate transistor device of claim 10 wherein said Schottky barrier is forward biased to a level below any forward bias on the junction between said first and second base regions.

* * * * *